United States Patent
Mayuzumi et al.

(10) Patent No.: US 7,359,212 B2
(45) Date of Patent: Apr. 15, 2008

(54) CONTROL DEVICE AND METHOD OF MANUFACTURING THEREOF

(75) Inventors: Takuya Mayuzumi, Hitachinaka (JP);
Shuji Eguchi, Kamagaya (JP);
Masahiro Sasaki, Hitachinaka (JP);
Kiyoomi Kadoya, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/243,319

(22) Filed: Oct. 5, 2005

(65) Prior Publication Data
US 2006/0077643 A1   Apr. 13, 2006

(30) Foreign Application Priority Data
Oct. 6, 2004   (JP)   ............... 2004-293183

(51) Int. Cl.
H05K 7/02   (2006.01)
H05K 7/06   (2006.01)
H05K 7/08   (2006.01)
H05K 7/10   (2006.01)

(52) U.S. Cl. .................................... 361/760
(58) Field of Classification Search .......... 361/704, 361/707, 719–720, 760–767, 796, 807–809
See application file for complete search history.

(56) References Cited

U.S. PATENT DOCUMENTS 5,353,194 A * 10/1994 Libretti et al. .............. 361/707

2006/0272150 A1 * 12/2006 Eguchi et al. ............... 29/841

FOREIGN PATENT DOCUMENTS

| DE | 197 55 765 A1 | 6/1999 |
|---|---|---|
| EP | 0 708 583 A1 | 4/1996 |
| FR | 2 735 942 A1 | 12/1996 |
| JP | 07-022722 | 1/1995 |
| JP | 2001-168476 A | 6/2001 |
| JP | 2001-288333 | 10/2001 |
| JP | 2001-288333 A | 10/2001 |
| JP | 2004-111435 A | 4/2004 |
| JP | 2004-206218 | 7/2004 |
| WO | WO 2005/004563 A1 | 1/2005 |

OTHER PUBLICATIONS

European Search Report dated Oct. 8, 2007 (Nine (9) pages).

* cited by examiner

*Primary Examiner*—Javaid H. Nasri
(74) *Attorney, Agent, or Firm*—Crowell & Moring LLP

(57) ABSTRACT

A module comprises a metallic terminal pins for connection and a circuit board with electronic components mounted thereon, a circuit board connecting side of the connector. The electronic components and the circuit board with the electronic components mounted thereon are encapsulated with the same resin. A metallic base is united to the module to obtain an electric conduction between the metallic base and the circuit board.

13 Claims, 3 Drawing Sheets

CONTROL DEVICE AND METHOD OF MANUFACTURING THEREOF

CLAIM OF PRIORITY

The present application claims priority from Japanese application serial no. 2004-293183, filed on Oct. 6, 2004, the content of which are hereby incorporated by reference into this application.

FIELD OF THE INVENTION

The present invention relates to a control device having electronic components mounted on a circuit board, and encapsulating the electronic components and the circuit board with a resin molding compound. Particularly, the present invention relates to a control device suitable for use as any of various control modules and sensor modules mounted on, for example, automobiles, farming machines, industrial machines and ships, as well as a method of manufacturing the control device.

BACKGROUND OF THE INVENTION

Conventional various control modules (e.g., engine control module, motor control module, automatic transmission control module) mounted on automobiles, farming machines, industrial machines and ships have been disposed within a vehicle interior room or an engine room. These control modules are generally constructed such that electronic components are mounted on a printed circuit board and the printed circuit board is fixed on a metallic base and is covered with a case.

Recently, studies have been made about a control module of the type in which the control module is mounted directly onto an intake manifold, i.e., on-engine type. Control modules using a printed circuit board are not applicable to the on-engine type because their heat resistance is about 120° C. Control modules using a ceramic circuit board are applicable to the on-engine type because their heat resistance is high, but are somewhat expensive.

On-engine type control modules, in comparison with those installed within a vehicle interior room or an engine room, are required to have not only high heat resistance but also high vibration resistance and complete air- and water-tightness. Such requirements are made not only for on-engine type control modules but also for sensor modules (e.g., pressure sensor module, air flow meter module).

To meet such requirements, as to a configuration of a module using a printed circuit board and applicable to the on-engine type, there is known such a configuration as in Japanese Patent Laid Open No. 2001-288333 wherein external lead terminals and a circuit board are formed integrally by transfer molding. There also is known such a configuration as in Japanese Patent Laid Open No. H7 (1995)-22722 wherein a connector and a circuit board are formed integrally by a low pressure (reduced pressure) molding method involving heat-curing a pasty resin. Further proposed are a module and a method of manufacturing the same, involving encapsulating with a thermosetting resin for the purpose of improving productivity and reliability and reducing size.

SUMMARY OF THE INVENTION

However, the above conventional methods involve encapsulating with a resin molding for ensuring vibration resistance and complete air- and water-tightness, with no consideration given to EMC resistance as an important factor in operation reliability of an electronic circuit and to dissipation of heat generated from electronic components. In addition, consideration has not been given sufficiently to the method of mounting module products in an automobile, a farming machine, an industrial machine or a ship.

Besides, the resins used in the above methods are electrical insulators and have heretofore been unable to conduct an electrically stable ground smoothly to a circuit board for the improvement of EMC resistance. Moreover, the resins are lower in thermal conductivity as compared with metallic materials such as iron, aluminum, copper, and alloys thereof, which have so far been used generally as base materials of control modules. Therefore, the resins make it impossible to mount high heat generating electronic components within a circuit. Further, the resins are lower in strength against external forces as compared with such metallic materials as iron, aluminum, copper, and alloys thereof so far used generally as base materials of control modules. Therefore, mounting position and mounting method for satisfying required vibration resistance and resistance to deformation stress encounter limits with consequent deterioration of productivity.

An object of the present invention is to provide a control device improved in EMC resistance, heat dissipating property and mounting property despite it being a module where a connector having metallic terminal pins for connection and an electronic circuit are encapsulated with a resin molding compound.

The above object is achieved by the claimed invention.

According to the present invention, for example, a control device is comprised of: plural electronic components for forming a control circuit; connector pins for connecting electrically the control circuit to external equipment; a circuit board with the connector pins and the plural electronic components installed thereon; and a metallic member on which the circuit board is mounted, and connected electrically to the circuit board, wherein the plural electronic components, the circuit board and a part of the connector pins are encapsulated in a resin molding compound.

According to such a configuration, it is possible to obtain an electrical contact via a metallic base which is used also for mounting the module while maintaining such effects as improved productivity and reliability and reduced size resulting from encapsulating with a resin molding compound. Consequently, an electrically stable ground necessary for the improvement of EMC resistance can be conducted smoothly to the circuit board. Moreover, since the metallic base high in thermal conductivity can be disposed near heat-generating components, it is possible to improve the heat dissipating property. Further, since the metallic base is used for mounting the module, it is possible to effect mounting by the same method as the conventional module mounting method using a metallic base.

Such plural objects as improving EMC resistance, heat dissipating property and mounting property of a resin-sealed module can be achieved at a time without impairing productivity and reliability, by the addition of only a metallic base.

DESCRIPTION OF THE PREFERRED EMBODIMENT

Figure 1:
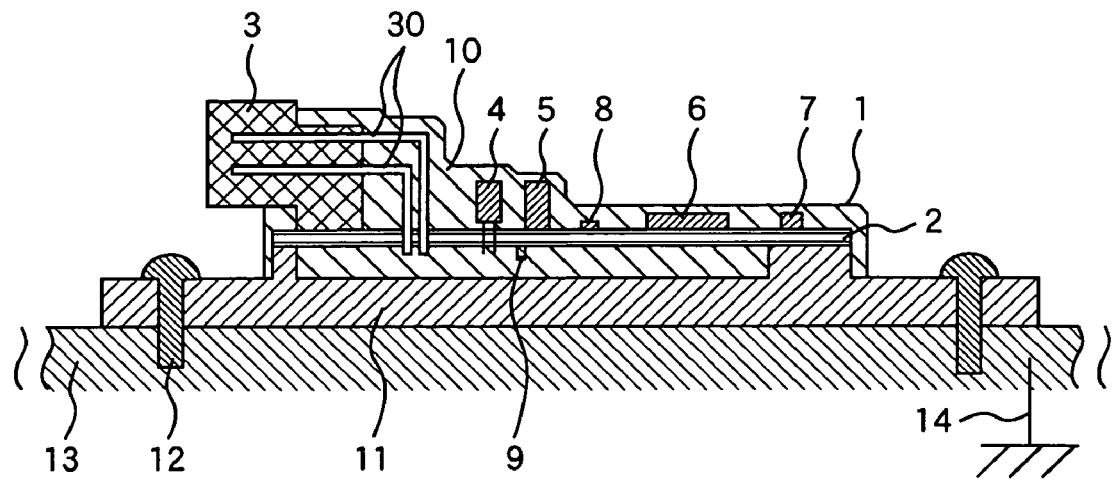
FIG. 1 is a partial sectional view showing the structure of a module according to a first embodiment of the present invention.

Embodiments of the present invention are shown in FIG. 1 to FIG. 6, components indicated with the same reference numerals in respective drawings are same components.

First Embodiment

FIG. 1 is a sectional view showing the structure of a module 1 according to a first embodiment of the present invention.

In this module, a circuit board is populated with a connector 3 including a metallic terminal pins (connector pins) 30 and electronic components such as a circuit board insertion type electronic component 4, a surface-mounted type large-sized electronic component 5, an IC 6, a high heat generating electronic component 7, a surface-mounted chip type electronic component 8, and a back-mounted chip type electronic component 9 etc. A part of the connector 3, a part of the connector pins 30, the electronic components and the circuit board 2 for populating them are encapsulated with a resin molding compound 10.

A metallic base 11 (a metallic member) on which the circuit board is mounted is united with the circuit board 2 to provide an electric conduction between the metallic base 11 and the circuit board 2. The module 1 is for use, for example, in an automobile, a farming machine, an industrial machine, or a ship.

The module 1 is fixed to a metallic mounting surface 13 such as an engine or a vehicle body with use of screws 12 or the like. The metallic mounting surface 13 such as an engine or a vehicle body is usually employed as a reference ground 14 of various electronic devices.

A conventional module itself, upon operation thereof, emits an electromagnetic radiation noise and obstructs the operation of not only electromagnetic wave receiving devices such as radio and TV but also various electronic devices. Therefore, it is required to reduce such radiation noises to a level not affecting other devices.

Further, the conventional module is required not to malfunction even upon receipt of a strong electromagnetic wave emitted from a device such as a radio communication device or a portable telephone. For improving such EMC characteristics, prevention measures have been taken such as using capacitor and inductance on a circuit board or implementing optimization of a circuit conductor pattern. In the module 1 of this embodiment, for making the aforementioned measures more effective, it is effective to draw into the circuit board 2 the stable reference ground 14 which is not affected by the operation of the module 1 and other devices.

To this end, as to an electrical contact between the circuit board 2 and the metallic base 11, it is theoretically most effective to connect the two at minimum inductance and impedance. It is preferable to connect the two throughout the whole surface of the circuit board. Actually, however, due to a restriction on the area of the circuit board 2, even contact throughout the outer periphery of the circuit board 2, contact at both sides of the circuit board in state of sandwiching the connector 3 therebetween, contact on the side opposite to the connector 3, contact on the connector 3 side, contact at all or some of the four corner portions of the circuit board 2, contact not at the outer periphery but at inside of the circuit board 2, or contact at a combined contact surface thereof, is fully effective.

This is the same as in the conventional module not encapsulated with a resin molding compound.

By thus using the metallic base 11, a heat transfer distance between the metallic base 11 and heat-generating electronic components populated on the circuit board 2 becomes shorter, and it becomes possible to widen the heat transfer area. Here, examples of such heat-generating electronic components are ICs 6 such as microcomputer, power IC and IPD; high heat generating electronic components 7 such as power transistor, power FET and power diode; in some cases, circuit board insertion type electronic components 4 such as electrolytic capacitor and inductance; surface-mounted type large-sized electronic components 5 such as electrolytic capacitor and inductance; and surface-mounted type electronic components 8 such as chip resistor and chip capacitor; and back-mounted chip type electronic components 9 such as chip resistor and chip capacitor.

Consequently, the heat generated upon operation of these electronic components can be dissipated to the exterior efficiently through the metallic base 11 which is formed of a metallic material high in thermal conductivity such as iron, aluminum, copper, or an alloy thereof.

When it is necessary to bring the metallic base 11 intentionally into contact with the heat generating electronic components or an electrical insulation is needed between the electronic components and the metallic base 11, an insulating sheet or an insulating adhesive may be sandwiched between the two or resin may be injected between the two at the time of encapsulating with use of the resin molding compound 10.

Whereby the metallic base 11 and the heat generating electronic components can be approximated to each other up to a minimum distance permitting promotion of the electrical insulation and it is thereby possible to improve the heat transfer characteristic. The metallic base 11 may be formed like heat dissipating fins to widen the area of contact with a gaseous medium such as air, or a passage which permits the flow of a cooling liquid medium such as water may be formed within the metallic base 11 to improve the cooling performance.

For preventing damage of the module 1 caused by a thermal stress based on the difference in thermal expansion coefficient between the main material of the circuit board 2 and the resin molding compound 10, it is preferable that the resin used in the resin molding compound 10 be as close as possible in thermal expansion coefficient to the main material of the circuit board 2. When a printed circuit board formed of an epoxy resin as a main material is used as the circuit board 2, the thermal expansion coefficient of the resin molding compound 10 takes a value in the range of 8 to $18 \times 10^{-6}$/K as a thermal expansion coefficient of an epoxy resin for transfer molding used in encapsulating a semiconductor, among thermosetting resins. In point of only thermal expansion coefficient in connection with the material of the metallic base 11, copper or a copper alloy containing copper as a main material has a thermal expansion coefficient of about 16 to $20\times10^{-6}$/K which is close to that of the aforesaid epoxy resin for transfer molding, and is thus preferable, but has a drawback of being apt to become rusty.

Therefore, it is preferable that copper or such copper alloy be subjected beforehand to, for example, coating for the prevention of corrosion, taking mounting conditions for the module 1 into account. From the standpoint of corrosion proofing and cost, as is the base with the conventional module not subjected to a resin molding, there also may be used aluminum or an aluminum-based alloy, iron or an iron-based alloy, or the iron-based alloy having been subjected to coating for the prevention of corrosion. In the module encapsulated with the aforementioned epoxy resin for transfer molding, it is preferable to use the aluminum-based alloy having a thermal expansion coefficient of 21 to $25\times10^{-6}$/K. In this connection, it is preferable to select a resin material superior in fluidity as the resin molding compound 10, exhibiting a small difference in thermal expansion coefficient from the aluminum alloy used and having a high bonding force for the circuit board 2 and the housing material of the connector 3 provided with a metallic connector pin and for the various electronic components.

The metallic base 11 formed of such a metallic material as referred to above can be fixed to the metallic mounting surface 13 such as the engine or the vehicle body by the same method as in the base of the conventional module not encapsulated with the resin molding. For example, as depicted in FIG. 1, the method involves contacting the metallic base 11 directly with the metallic mounting surface 13 such as the engine or the vehicle body and then fixing it with module-fixing-screws 12. Alternatively, for the purpose of improving the vibration resistance or reducing the mounting stress, there may be adopted a method where a metallic bracket is disposed between the metallic base 11 and the metallic mounting surface 13 and then the metallic base 11 is fixed using screws or the like.

The metallic base 11 may be disposed on only the whole undersurface of the module 1 as shown in FIG. 1, but for the purpose of improving the resistance to electronic radio wave and impact resistance, the metallic base 11 may be formed like enclosure with a wide area so as to cover the whole of the module 1. The metallic base 11 may take a number of forms instead of the aforementioned forms. For example, since the module 1 is protected by the resin molding compound 10, the metallic base 11 may take the form of a case with an opening, taking into account the strength of the resin molding compound 10 against vibration resistance, etc. in a state of actual use. According to thus structure, although an area where the metallic base 11 covers the module 1 is narrow as compared with the enclosure type base, the purpose of improving the connecting force between the metallic base 11 and the resin molding compound 10 is attained. In this case, resin for the resin molding compound 10 is poured into the metallic base 11 through the opening thereof. In order to obtain cost reduction, the metallic base 11 may be disposed in a narrower area by widening the opening of the metallic base 11 or reducing the size of the base. Further, the metallic base 11 may be disposed not only below the portion where the connector 3 is disposed, but also above the portion or on the side opposite to the connector 3 or around the connector.

In the case of applying the module 1 to sensor for measuring atmospheric pressure, the electric components and the circuit board is encapsulated with the resin molding while allowing only measuring portion of the sensor to be exposed to the exterior. Thereby it is possible to obtain such a sensor function. Furthermore, in the case of using the module 1 as the atmospheric pressure sensor, such a function can be obtained by forming a vent hole in the connector 3 and conducting a to-be-sensed gas into the interior of the module 1.

Second Embodiment

Figure 2:
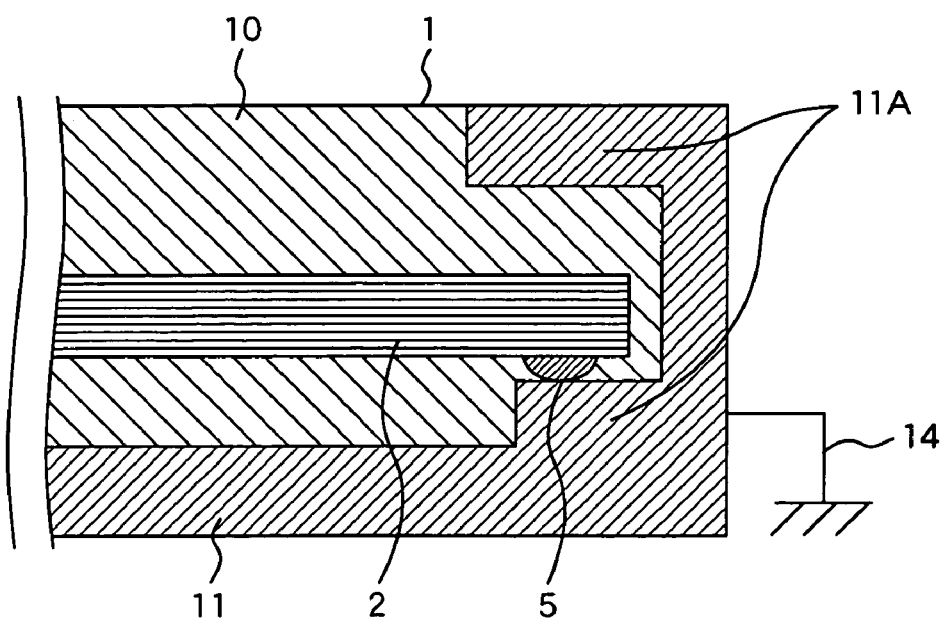
FIG. 2 is a partial sectional view showing the structure of a module according to a second embodiment of the present invention.

FIG. 2 is a partial sectional view showing the structure of a module 1 according to a second embodiment of the present invention which module is to be used, for example, in an automobile, a farming machine, an industrial machine or a ship. In this second embodiment, a difference from the previous first embodiment will be described as follows. The periphery 11A of the metallic base 11 has a form of a lateral U-shaped channel whose opening faces in an inward direction of the base 11. The periphery of the circuit board 2 which is in contact with the metallic base 11 is inserted into the lateral U-shaped channel of the metallic base 11, and resin for the resin molding compound 10 is poured and molded in the metallic base 11 at a high temperature and then cooled to the normal working temperature. The thermal expansion coefficient of the metallic base 11 is higher than that of the resin molding compound 10. As a result, according to the structure of the second embodiment, a thermal stress acting to press the circuit board against the metallic base 11 is produced from the metallic base 11 through the resin molding compound 10. Thus, an electric conduction between the metallic base 11 connected to the reference ground 14 and the circuit board 2 can be attained more effectively than in the first embodiment, without using any special part.

In the case that the resin molding compound 10 and the metallic base 11 are united as shown in the first embodiment, even though the thermal expansion coefficient of the metallic base 11 is higher than that of the resin molding compound 10, by adopting configuration shown in FIG. 2, it makes possible to obtain a sufficient electrical conduction between the metallic base 11 and the circuit board 2.

Contrarily, if in the case that the thermal expansion coefficient of the metallic base 11 is lower than that of the resin molding compound 10, it is advisable that a part of the resin molding compound 10 encloses the circuit board 2 and the metallic base 11 where they are contacted with each other, conversely to FIG. 2. According to such a structure, a thermal stress acting to press the circuit board against the metallic base 11 is produced from the resin molding compound 10. Thereby, as in the case of the second embodiment, an electric conduction between the metallic base 11 connected to reference ground 14 and the circuit board 2 can be attained more effectively, without using any special part.

For added improvement of the connection between the circuit board 2 and the metallic base 11, the resin molding compound may be formed after a conductive material 15 such as solder and an electrically conductive adhesive is applied to the circuit board 2, as shown in FIG. 2.

The metallic base 11 may be mounted at the same position as in the first embodiment, and it may be required that the metallic base 11 is provided on the outer surface of the module 1 from a structure viewpoint. Although the position of the electric conduction between the metallic base 11 and the circuit board 2 also lies on the outer surface of the module 1, the form of the electric conduction can vary depending on product conditions of the module 1 as in the method described in the first embodiment.

For attaining the above electric conduction, it is preferable that the solder or electrically conductive adhesive 15 is applied so as to provide conduction over a wide area and keep the impedance and inductance low. However, if the area is too wide, it is difficult to control the height accuracy of the solder or electrically conductive adhesive 15 as liquid at the time of application thereof. Therefore, it is preferable that the solder or conductive adhesive area to be applied is decentralized into plural areas and each of the plural to-be-applied areas is limited under the condition that the height of the solder or electrically conductive adhesive can be controlled.

Third Embodiment

Figure 3:
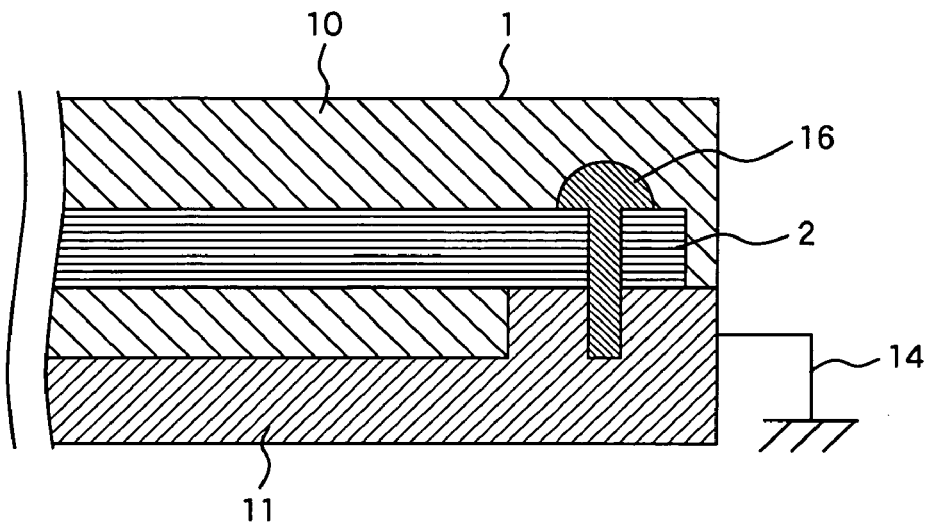
FIG. 3 is a partial sectional view showing the structure of a module according to a third embodiment of the present invention.

FIG. 3 is a partial sectional view showing the structure of a module 1 according to a third embodiment of the present invention which module is to be used, for example, in an automobile, a farming machine, an industrial machine or a ship. In this third embodiment, a difference from the first embodiment will be described as follows. The metallic base 11 and the circuit board 2 are kept in contact with each other using metallic base-fixing-screws 16 as in the conventional module not molded with resin. A stress acting to press the circuit board 2 against the metallic base 11 is produced by the screws 16. Thereby an electric connection between the metallic base 11 connected to the reference ground 14 and the circuit board 2 is attained more effectively than in the first embodiment.

The same mounting position of the metallic base 11 as in the first embodiment can be selected, but since the metallic base-fixing-screws 16 are passed through the circuit board 2, if the number of the screws 16 is large, the area of mounting the electronic components on the circuit board 2 is limited. Therefore, it is preferable that the number of screws 16 be about one to six corresponding to a minimum number in view of the following conditions: an electric conduction between the metallic base 11 and the circuit board 2 can be obtained effectively; the distance between the metallic base 11 and the circuit board 2 can be kept to a minimum for radiating heat from various heat generating components mounted on the circuit board 2; and a sufficient holding force for both metallic base 11 and circuit board 2 can be ensured.

Further, as in the case of the second embodiment, there may be adopted a method involving applying the electrically conductive material 15 such as solder or an electrically conductive adhesive as in FIG. 2. Subsequently, the metallic base 11 and the circuit board 2 are fixed to each other using the metallic-base-fixing screws 16, and the resin molding is performed. Thereby, the electric conduction between the metallic base 11 and the circuit board 2 can be improved.

Fourth Embodiment

Figure 4:
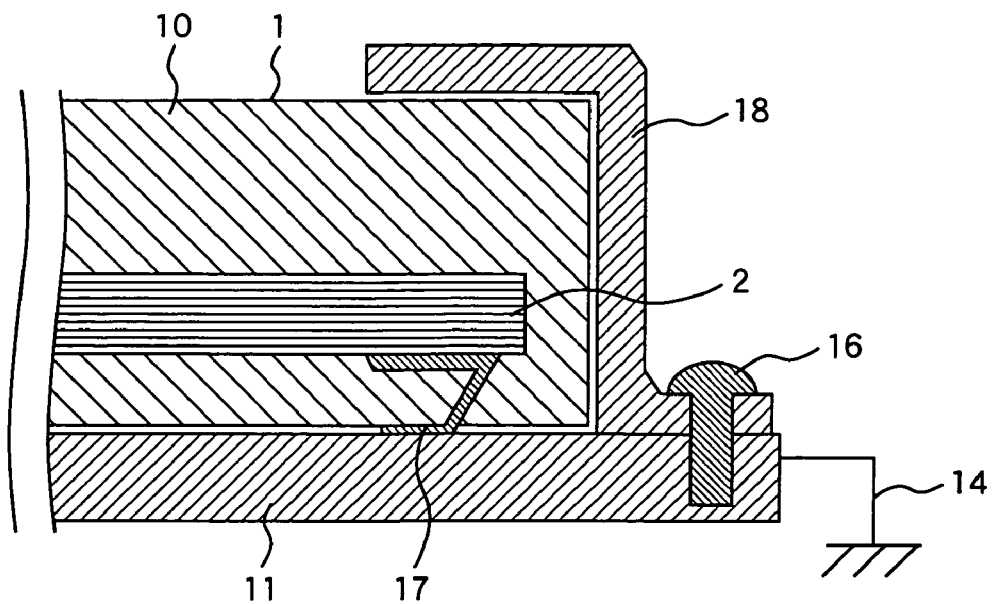
FIG. 4 is a partial sectional view showing the structure of a module according to a fourth embodiment of the present invention.

FIG. 4 is a partial sectional view showing the structure of a module 1 according to a fourth embodiment of the present invention which module is to be used, for example, in an automobile, a farming machine, an industrial machine or a ship. In this fourth embodiment, a difference from the first embodiment will be described as follows. A metallic spring 17 is attached to the circuit board 2 as means for attaining an electric conduction between the metallic base 11 and the circuit board 2, thereafter the circuit board 2 and the spring 17 are integrally encapsulated with resin as the molding compound 10 so that a free end of the spring 17 is drawn out from the resin. The free end thus drawn out is brought into contact with the metallic base 11. Thereby an electric conduction between the metallic base 11 connected to the reference ground 14 and the circuit board 2 is attained more effectively than in the first embodiment.

After forming the module 1 with the resin molding compound 10, the metallic base 11 may be attached to the module 1. In this case, for improving the contact stability between the metallic base 11 and the end of the spring 17, it is effective to adopt a method where the module 1 after performing the resin molding is partially sandwiched between the metallic base 11 and a holding cover 18. A sandwiching stress is generated between the metallic base 11 and the holding cover 18 by means of each screw 16.

The metallic spring 17 can be fixed by pressing it against the circuit board 2 at the time of forming the resin molding compound 10. But as is the case with various electronic components mounted on the circuit board 2, the metallic spring 17 may be fixed to the circuit board 2 with use of solder or an electrically conductive adhesive and thereafter the resin molding compound may be performed. At this time the spring 17 can be mounted to the circuit board 2 easily by selecting the shape of the spring 17 and a packaging method therefor so as to match an automatic packaging machine. Furthermore, an elongation of the metallic spring 17 can be limited within a required dimensional range, by pressing the metallic spring 17 against a mold for resin molding during forming the resin molding compound 10.

For ensuring the electric contact of the metallic spring 17 against the metallic base 11, it is preferable that the metallic spring is disposed within the resin portion (a part of the resin molding compound 10) sandwiched between the metallic base 11 and the holding cover 18, namely at a position where the sandwiching force is strong. The metallic spring 17 may not be always disposed within the resin portion sandwiched between them, its disposition is depending on the arrangement of the metallic base 11 and the holding cover 18. In some positions, a sufficient sandwiching force for the metallic spring can be obtained even in the portion of only the metallic base 11 free of the holding cover 18, so that the metallic spring 17 can be disposed also in such a portion.

In this fourth embodiment, unlike the methods described in the first and second embodiments, it is not necessary to bond the metallic base 11 and the resin molding compound 10 together. Therefore, it is not necessary to match the thermal expansion coefficient of the resin molding compound 10 with that of the metallic base 11, and it is possible to provide the module 1 superior in the resistance of heat-cycle performance.

The same disposition of the metallic base 11 as in the first embodiment may be selected in this embodiment, but it is preferable that the holding cover 18 is disposed on the periphery of the module 1. In the case of improving the resistance to electric radio wave, impact resistance and water resistance of the module, the holding cover 18 may be disposed not only on the periphery portion of the module 1 but also throughout the whole of the module's surface opposite to the metallic base 11. Further, the holding cover 18 may be disposed limitedly to a specific portion as in the layout of the metallic base 11 described in the first embodiment.

Fifth Embodiment

Figure 5:
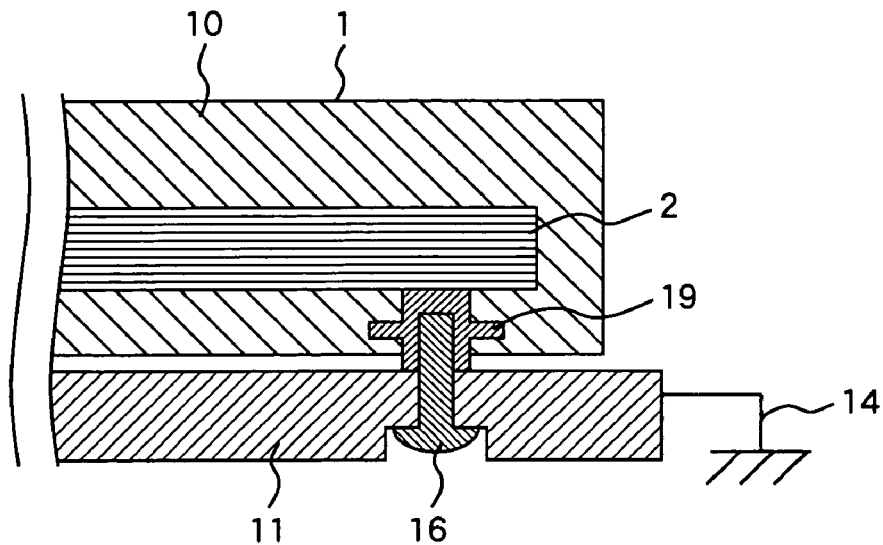
FIG. 5 is a partial sectional view showing the structure of a module according to a fifth embodiment of the present invention.

FIG. 5 is a partial sectional view showing the structure of a module 1 according to a fifth embodiment of the present invention which module is to be used, for example, in an automobile, a farming machine, an industrial machine or a ship. In this fifth embodiment, a difference from the first embodiment will be described as follows. Metallic spacers 19 which can be provided with a convex concave portion are attached to the circuit board 2 for attaining an electric conduction between the metallic base 11 and the circuit board 2. The circuit board 2 and the metallic spacers 19 are integrally encapsulated with the resin molding compound 10. After forming the module 1 with the resin molding compound 10, the metallic base 11 is attached to the module 1. One end of each metallic spacer 19 is drawn out from the resin molding compound 10, and the one end thus drawn out is brought into contact with the metallic base 11. Thereby an electric conduction between the metallic base 11 connected to the reference ground 14 and the circuit board 2 is attained more effectively than in the first embodiment.

In this case, for improving the contact stability between the metallic base 11 and the end of each metallic spacer 19 contacted with the metallic base, the metallic base 11 and each metallic spacer 19 may be connected together using metallic base-fixing-screws 16. Each metallic spacer 19 is provided with a tapped hole. Each screw 16 is screwed in the tapped hole via a through hole provided to the metallic base. A disc-like projection is formed around an intermediate portion of the metallic spacer 19, and the disc-like projection is buried in the resin molding compound 10. Thereby, the bonding force and fitting force between the metallic spacer 19 and the resin molding compound 10 can be enhanced, and a sufficient strength can be ensured even with the metallic spacer 19 which is small-sized.

Each metallic spacers 19 can be fixed by pressing it against the circuit board 2 during forming in the resin molding compound 10. But as is the case with various electronic components populated on the circuit board 2, the metallic spacer 19 may be fixed to the circuit board 2 using, for example, solder or an electrically conductive adhesive and thereafter the resin molding compound 10 may be performed. In this case, the metallic spacer 19 can be populated to the circuit board 2 easily by selecting the shape of the metallic spacer 19 and a packaging method therefor so as to match an automatic packaging machine. In the case of soldering, it is preferable to effect soldering so that the amount of solder can be controlled by using solder paste or the like in order to control the height accuracy of the metallic spacer 19 in a populated state of the spacer.

In this fifth embodiment, as in the fourth embodiment, it is not necessary to bond the metallic base 11 and the resin molding compound 10 together. Therefore, it is not necessary to match the thermal expansion coefficient of the resin molding compound 10 with that of the metallic base 11, and it is possible to provide the module 1 superior in the resistance of heat-cycle performance.

The same disposition of the metallic base 11 as in the first embodiment may be selected in this embodiment. A distance between the metallic base 11 and the circuit board 2 is controlled under the extent that an excessive stress is not imposed on the metallic spacer 19 and the screws 16 by screwing of the screws 16.

Sixth Embodiment

Figure 6:
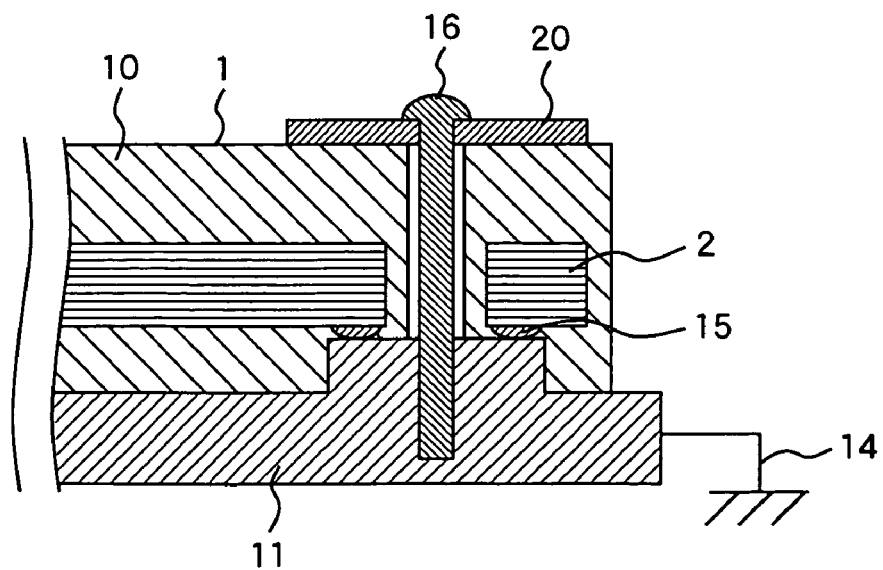
FIG. 6 is a partial sectional view showing the structure of a module according to a sixth embodiment of the present invention.

FIG. 6 is a partial sectional view showing the structure of a module 1 according to a sixth embodiment of the present invention which module is to be used, for example, in an automobile, a farming machine, an industrial machine or a ship. In this sixth embodiment, a difference from the first embodiment will be described as follows. At least a part of the metallic base 11 is contacted with the circuit board 2 for attaining an electric conduction between the metallic base 11 and the circuit board 2. The metallic base 11 is provided with tapped holes at the respective contact positions between the circuit board 2 and the metallic base 11. The resin molding compound 10 for encapsulating the circuit board 2 and the circuit board 2 are provided with through holes for screws. The metallic base 11 is integrally bonded with the resin molding compound 10. The through holes are opened in a direction perpendicular to the surface of contact between the metallic base 11 and the circuit board 2. After forming the resin molding compound 10 on the metallic base 11, each screw 16 is inserted into the through hole from the resin molding compound opposite to the metallic base 11, and the screw 16 is screwed in the tapped hole of the metallic base. Thereby an electric conduction between the metallic base 11 connected to the reference ground 14 and the circuit board 2 can be attained more effectively than in the first embodiment.

Further, each module-holding-washer 20 with a wide area is sandwiched between each screw 16 and the resin molding compound 10, a holding force for attaining an electric conduction between the metallic base 11 and the circuit board 2 can be obtained without exerting any excessive stress on the resin molding compound 10. In this case, for improving the electric conduction between the circuit board 2 and the metallic base 11, it is effective to apply solder or an electrically conductive adhesive 15 to the circuit board 2.

In this embodiment, the metallic base 11 may be provided with through holes for the respective screws 16 instead of the tapped holes. In this case, the tapped holes are disposed on the bracket described in the first embodiment between the metallic base 11 and the metallic mounting surface 13 such as the engine or the vehicle body. The bracket and the module 1 are fixed together by the screw 16 without exerting a direct stress on the circuit board 2. A clamping force between the circuit board 2 and the metallic base 11 is produced to attain an electric conduction with the screwed force. With the same structure, the module can also be fixed directly to the metallic mounting surface 13 such as the engine or the vehicle body without interposition of the bracket.

In this case, the area of the circuit board 2 increases because the area of the through holes for screw 16 is needed on the circuit board 2. However, since there are omissible portions as to areas of module 1 and the metallic base 11 to be mounted on the surface 13 (described in FIG. 1) such as the engine or the vehicle body, it is possible to reduce the size of the module 1 and the metallic base 11 depending on such omissible portions.

According to the module of the present invention it is easy to obtain such effects as improvement of productivity and reliability and reduction of size of various conventional control modules (e.g., engine control module, motor control module, automatic transmission control module) and sensor modules (e.g., pressure sensor module, air flow meter module). Further, it is possible to increase the mounting freedom while reducing the cost of various control modules (e.g., brake control module, suspension control module, steering control module, air bag control module, seat belt control module, vehicle-to-vehicle distance measuring module) which provide a promising active safety function, various electronic modules (e.g., portable telephone communication module, ETC communication module, GPS communication module, VICS communication module) which perform information exchange using an electronic radio wave between them and the exterior of a vehicle for obtaining such a function as ITS, and various control modules (e.g., fuel cell control module, lithium ion battery charge/discharge control module) used in devices utilizing chemical changes because of a high chemicals resistance.

What is claimed is:

1. A control device comprising:
   plural electronic components for forming a control circuit;
   connector pins for connecting electrically the control circuit to external equipment;
   a circuit board with the connector pins and the plural electronic components installed on both sides thereof;
   a metallic member having a metallic projection for mounting the circuit board thereon, and connected electrically to the circuit board, and
   a screw is provided to fix the circuit board to the metallic projection,
   wherein the plural electronic components, the circuit board and a part of the connector pins are encapsulated in a resin molding compound.

2. The control device according to claim 1, further comprising solder applied to the circuit board and encapsulated in the resin molding compound together in the plural electronic components, the circuit board and the connector pins,
   wherein the circuit board and the metallic member are electrically connected with each other through the solder.

3. The control device according to claim 1, further comprising a metallic spacer fixed to the circuit board and encapsulated with the resin molding compound together in the plural electronic components, the circuit board and the connector pins,
   wherein the circuit board and the metallic member are electrically connected with each other through the metallic spacer.

4. The control device according to claim 3, wherein the circuit board and the metallic member are electrically connected with each other through the screw.

5. The control device according to claim 1, the circuit board and the metallic member are electrically bonded with each other through a conductive adhesive.

6. A control device comprising:
   plural electronic components for forming a control circuit;
   connector pins for connecting electrically the control circuit to external equipment;
   a circuit board with the connector pins and the plural electronic components installed on both sides thereof;
   a metallic member having a metallic projection for mounting the circuit board thereon, and connected electrically to the circuit board, and
   a screw is provided to fix the circuit board to the metallic projection,
   wherein the plural electronic components, the circuit board and a part of the connector pins are encapsulated in a resin molding compound, and an at least partial region of the resin molding compound is sandwiched by the metallic member and electronic components.

7. The control device according to claim 6, wherein the metallic member is electrically connected to the circuit board in at least two positions.

8. The control device according to claim 6, the circuit board and the metallic member are electrically connected with each other in the sandwiched partial regions of the resin molding compound.

9. The control device according to claim 6, wherein, a thermal expansion coefficient of the resin molding compound is smaller than that of the metallic member.

10. The control device according to claim 6, further comprising solder applied to the circuit board and encapsulated in the resin molding compound together in the plural electronic components, the circuit board and the connector pins,
    wherein the circuit board and the metallic member are electrically connected with each other through the solder.

11. The control device according to claim 6, further comprising a metallic spacer fixed to the circuit board and encapsulated with the resin molding compound together in the plural electronic components, the circuit board and the connector pins,
    wherein the circuit board and the metallic member are electrically connected with each other through the metallic spacer.

12. The control device according to claim 11, wherein the circuit board and the metallic member are electrically connected with each other through the screw.

13. The control device according to claim 6, the circuit board and the metallic member are electrically bonded with each other through a conductive adhesive.

* * * * *